(12) United States Patent
Roohparvar

(10) Patent No.: US 8,796,818 B2
(45) Date of Patent: *Aug. 5, 2014

(54) N WELL IMPLANTS TO SEPARATE BLOCKS IN A FLASH MEMORY DEVICE

(71) Applicant: Micron Technology, Inc., Boise, ID (US)

(72) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/901,088

(22) Filed: May 23, 2013

(65) Prior Publication Data

US 2013/0256831 A1 Oct. 3, 2013

Related U.S. Application Data

(60) Continuation of application No. 13/324,214, filed on Dec. 13, 2011, now Pat. No. 8,455,974, which is a division of application No. 12/246,142, filed on Oct. 6, 2008, now Pat. No. 8,084,843, which is a division of application No. 11/126,826, filed on May 11, 2005, now Pat. No. 7,443,009.

(51) Int. Cl.
*H01L 21/70* (2006.01)

(52) U.S. Cl.
USPC .................... 257/544; 257/E21.544; 257/550

(58) Field of Classification Search
USPC .................... 257/544–551, E21.544
See application file for complete search history.

(56) References Cited

U.S. PATENT DOCUMENTS

| | | | |
|---|---|---|---|
| 5,159,427 A | 10/1992 | Ogura et al. | |
| 5,973,366 A | 10/1999 | Tada | |
| 6,677,198 B2 | 1/2004 | Hsu et al. | |
| 6,750,527 B1* | 6/2004 | Momohara | 257/511 |
| 6,913,974 B2 | 7/2005 | Hung et al. | |
| 6,914,826 B2 | 7/2005 | Hung et al. | |
| 7,443,009 B2* | 10/2008 | Roohparvar | 257/544 |
| 8,084,843 B2* | 12/2011 | Roohparvar | 257/544 |
| 8,455,974 B2* | 6/2013 | Roohparvar | 257/509 |
| 2004/0031996 A1* | 2/2004 | Li et al. | 257/408 |
| 2005/0057966 A1 | 3/2005 | Nazarian | |

* cited by examiner

*Primary Examiner* — Allison P Bernstein
(74) *Attorney, Agent, or Firm* — Dicke, Billig & Czaja, PLLC

(57) ABSTRACT

A semiconductor memory device that has an isolated area formed from one conductivity and formed in part by a buried layer of a second conductivity that is implanted in a substrate. The walls of the isolated area are formed by implants that are formed from the second conductivity and extend down to the buried layer. The isolated region has implanted source lines and is further subdivided by overlay strips of the second conductivity that extend substantially down to the buried layer. Each isolation region can contain one or more blocks of memory cells.

23 Claims, 5 Drawing Sheets

N WELL IMPLANTS TO SEPARATE BLOCKS IN A FLASH MEMORY DEVICE

RELATED APPLICATIONS

This is a continuation of U.S. application Ser. No. 13/324,214, titled "N WELL IMPLANTS TO SEPARATE BLOCKS IN A FLASH MEMORY DEVICE," filed Dec. 13, 2011 and issued as U.S. Pat. No. 8,455,974 on Jun. 4, 2013, which is a divisional of U.S. application Ser. No. 12/246,142, titled "N WELL IMPLANTS TO SEPARATE BLOCKS IN A FLASH MEMORY DEVICE," filed Oct. 6, 2008 and issued as U.S. Pat. No. 8,084,843 on Dec. 27, 2011, which is a divisional of U.S. application Ser. No. 11/126,826, titled "N WELL IMPLANTS TO SEPARATE BLOCKS IN A FLASH MEMORY DEVICE," filed May 11, 2005 and issued as U.S. Pat. No. 7,443,009 on Oct. 28, 2008, all of which are commonly assigned and incorporated in their entirety herein by reference.

TECHNICAL FIELD

The present invention relates generally to memory devices and in particular the present invention relates to flash memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

A flash memory is a type of memory that can be erased and reprogrammed in blocks instead of one byte at a time. Each of the memory cells includes a floating gate field-effect transistor capable of holding a charge. Each of the cells can be electrically programmed on a random basis by charging the floating gate. The data in a cell is determined by the presence or absence of the charge in the floating gate. The charge can be removed from the floating gate by a block erase operation.

FIG. 1 illustrates a simplified cross-sectional view of a typical flash memory device substrate. The substrate 100 is comprised of p-type silicon in which a plurality of n-wells 103, 104 are formed. A deep n-layer 101, in conjunction with the n-wells 103, 104, can produce an isolated p region 105 in which n-channel memory cells can be formed. For example, n+ source lines 106-109 are illustrated in FIG. 1.

This large p area 105 has a large capacitance, typically on the order of 5 to 10 nF, depending on the size of the memory device. During an erase operation, this capacitance has to be charged to 20V and back to 0V many times with verify operations performed in between the charge and discharge cycles. This requires a relatively large amount of current and time.

In addition to the large capacitance problem, memory devices can also experience an erase disturb condition that may eventually limit the number of times that a cell can be erased. Since all of the memory blocks of an array share the same substrate, unselected memory blocks also experience the 20V on their substrate during an erase operation. The unselected word lines are typically left floating during the erase operation such that coupling from the substrate causes these word lines to charge up to a high state. This can create a potential disturb condition. In a substantially similar way, the memory blocks can experience a program disturb condition in the memory substrate of FIG. 1.

For the reasons stated above, and for other reasons stated below which will become apparent to those skilled in the art upon reading and understanding the present specification, there is a need in the art for a memory device that requires reduced current for memory operations and experiences reduced disturb conditions.

DETAILED DESCRIPTION

Figure 1:
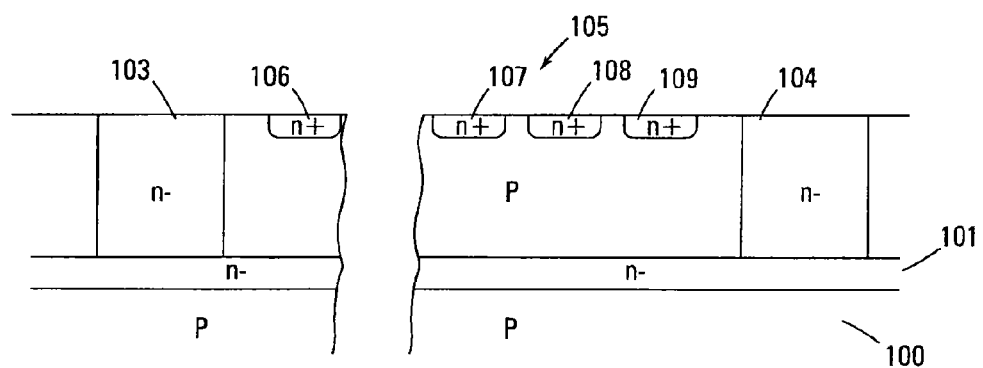
FIG. 1 shows a cross-sectional view of a typical prior art memory device substrate.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

The subsequent discussion of the embodiments of the present invention refers to the architecture of flash memory devices. However, the present invention is not limited to any one type of memory device.

Figure 2:
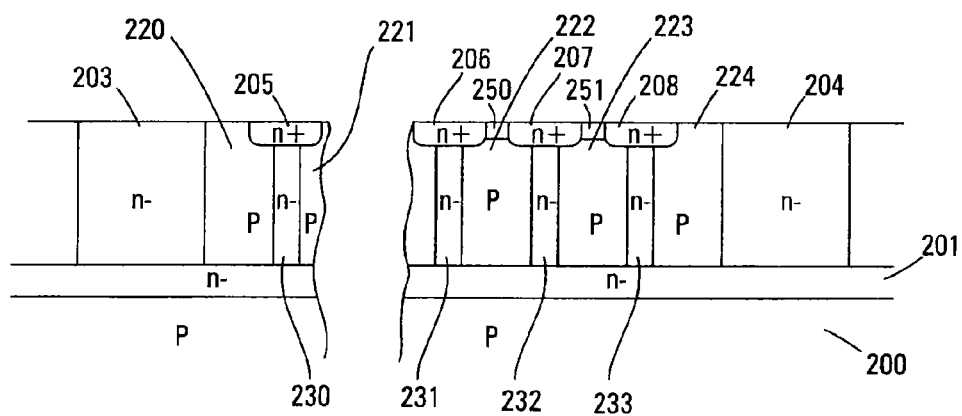
FIG. 2 shows a cross-sectional view of one embodiment of the memory device of the present invention with n-wells implanted in the source lines.

FIG. 2 illustrates a cross-sectional view of one embodiment of the memory device of the present invention with n-31 wells implanted in the source lines. This figure is not drawn to scale.

The embodiment of FIG. 2 is illustrated with p-type silicon material and n− implants. However, the present invention is not limited to any one conductivity type or material choice. An alternate embodiment can use an n-type silicon or some other semiconductor material.

The embodiment is comprised of a p substrate 200 with an implanted n layer 201. In one embodiment, the p-type substrate 200 is p- doped and the implanted n layer 201 is an n- layer 201 that is implanted one micron below the surface of the substrate. However, this distance is for purposes of illustration only as the present invention is not limited to any one set of dimensions.

Figure 6:
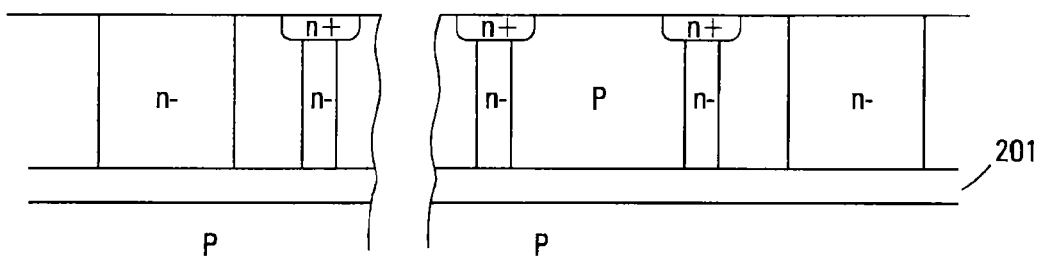
FIG. 6 shows a cross-sectional view of another embodiment of the memory device of the present invention with an insulator layer.

In an alternate embodiment, the buried layer 201 is an insulator layer, as illustrated in FIG. 6. Such a layer 201 could be used in silicon-on-insulator technology.

A plurality of deep n-wells 203, 204 are implanted substantially down to the n- layer 201. This leaves a p-type area that is isolated from the remainder of the substrate 200. The n- areas 203, 204 can be used to form p-channel transistors for various circuits of the memory device. The isolated p-type area can then be used to form n-channel elements. A memory die may contain a large quantity of n-well areas as illustrated in FIG. 2.

A plurality of source lines 205-208 are implanted into the isolated p area. In the illustrated embodiment, these areas are n+ areas. The quantity of source lines 205-208 depends on the quantity of blocks formed in the p-type isolated area. In one embodiment, there are 2048 blocks and, therefore, 2048 source lines 205-208. Alternate embodiments may use different quantities of source lines.

A plurality of n regions 230-233 are superimposed over the n+ source implants 205-208. In one embodiment, these isolating strips are n- regions 230-233 that extend through the source lines 205-208 and substantially down to the n- layer 201, effectively dividing up the isolated p-type area into a plurality of isolated sub-regions 220-224 that are p-type areas. Separate memory blocks 250, 251 can then be fabricated in each sub-region 220-224. In an alternate embodiment, more than one memory block may be fabricated in each sub-region 220-224.

Figure 5:
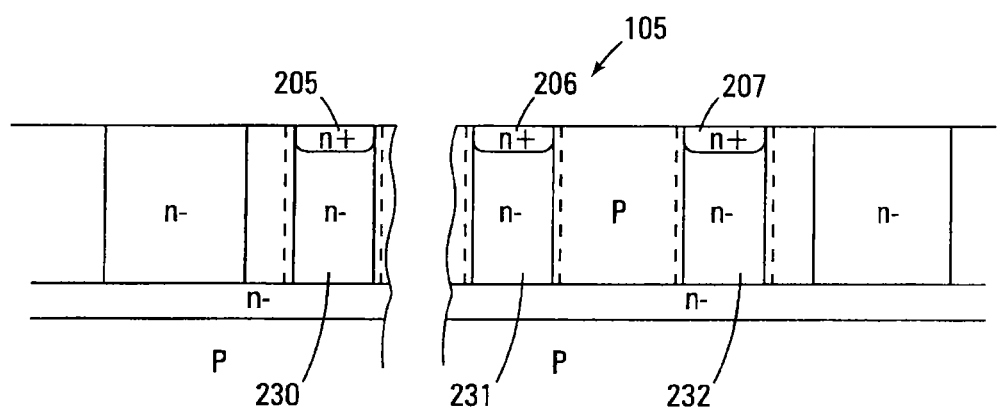
FIG. 5 shows a cross-sectional view of another embodiment of the memory device of the present invention with n−wells implanted in the source lines.

In one embodiment, the implanted n+ source lines 205-208 have the same width as the implanted n- regions 230-233, as illustrated in FIG. 5. In an alternate embodiment, the source lines 205-208 have a greater width than the n- regions 230-233 as illustrated by the dotted lines of FIG. 5. The substrate of FIG. 2 is not illustrated to scale. The n- regions 203, 204, 230-233 of the present invention are not required to be any fixed width. For example, the n- wells 203, 204 can be the same size as the n- regions 230-233 that divide up the isolated p-type area.

If the n+ source lines 205-208 are made wider than the n- regions 230-233, this may have a negative impact on the density of the memory. Larger source lines 205-208 would mean larger memory strings in each isolated region 220-224, thus requiring more substrate space for a given amount of memory. In such an embodiment, the n-well implants 230-233 may not be used for every memory string.

For example, one embodiment may use the n-well implants 230-233 every sixteen strings. This would reduce the overhead required for each implant 230-233 while still isolating every sixteen memory blocks. Alternate embodiments can form the implants 230-233 at N intervals where N>1.

The segregation of each of the isolated p-type regions 220-224 of the present invention substantially reduces the amount of capacitance inherent in each region 220-224. Therefore, the amount of charge required to take one, or a small quantity of, such region 220-224 to 20V and back to 0V for an erase operation on memory block or blocks resident in a respective region is substantially reduced. The disturb condition is also improved since not all of the memory strings experience the high voltages for erase and program operations. Only one block or, depending on the embodiment, a small quantity of blocks have their isolated substrate biased at the higher voltage.

Figure 3:
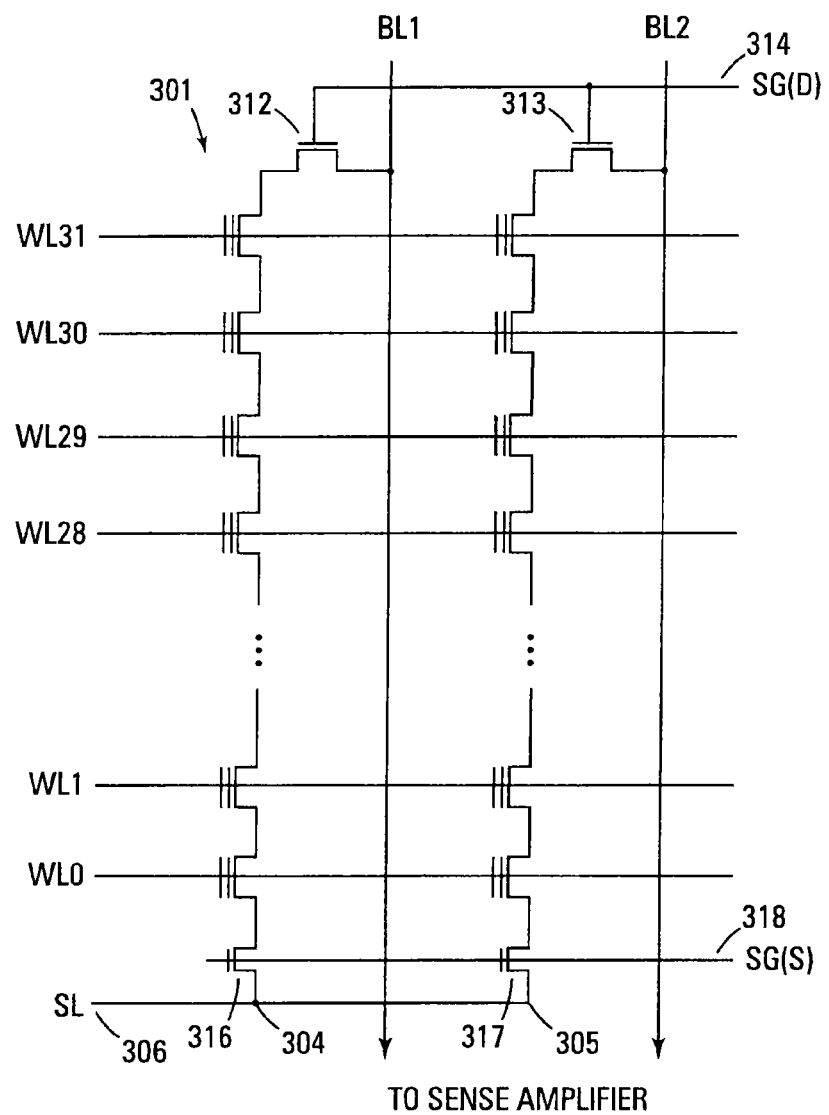
FIG. 3 shows a simplified schematic diagram of one embodiment of a NAND memory array of the present invention.

FIG. 3 illustrates a simplified diagram of one embodiment for a portion of a NAND flash memory array of the present invention. The memory array of FIG. 3, for purposes of clarity, does not show all of the elements typically required in a memory array. For example, only two bit lines are shown (BL1 and BL2) when the number of bit lines required actually depends upon the memory density. The bit lines are subsequently referred to as (BL1-BLN).

The array is comprised of an array of floating gate cells 301 arranged in series columns 304, 305. Each of the floating gate cells 301 are coupled drain to source in each series chain 304, 305. A word line (WL0-WL31) that spans across multiple series strings 304, 305 is coupled to the control gates of every floating gate cell in a row in order to control their operation. The bit lines (BL1-BLN) are eventually coupled to sense amplifiers (not shown) that detect the state of each cell.

In operation, the word lines (WL0-WL31) select the individual floating gate memory cells in the series chain 304, 305 to be written to or read from and operate the remaining floating gate memory cells in each series string 304, 305 in a pass through mode. Each series string 304, 305 of floating gate memory cells is coupled to a source line 306 by a source select gate 316, 317 and to an individual bit line (BL1-BLN) by a drain select gate 312, 313. The source select gates 316, 317 are controlled by a source select gate control line SG(S) 318 coupled to their control gates. The drain select gates 312, 313 are controlled by a drain select gate control line SG(D) 314.

During a typical prior art programming operation, the selected word line for the flash memory cell to be programmed is biased with a series of incrementing voltage programming pulses that start at an initial voltage that is greater than a predetermined programming voltage (e.g., approximately 16V). After each programming pulse, a verification operation with a word line voltage of 0V is performed to determine if the cell's threshold voltage $V_t$ has increased to the properly programmed level (e.g., 0.5V).

The unselected word lines for the remaining cells are typically biased at a voltage that is less than the programming voltage (e.g., approximately 10V) during the program operation. In one embodiment, the unselected word line voltages can be any voltage above ground potential. Each of the memory cells is programmed in a substantially similar fashion.

The memory cells are usually grouped into memory blocks. A block is typically defined by the total number of bits per word line multiplied by the total number of cells per string. A block is further broken down into pages. A memory block is typically comprised of 64 pages.

Figure 4:
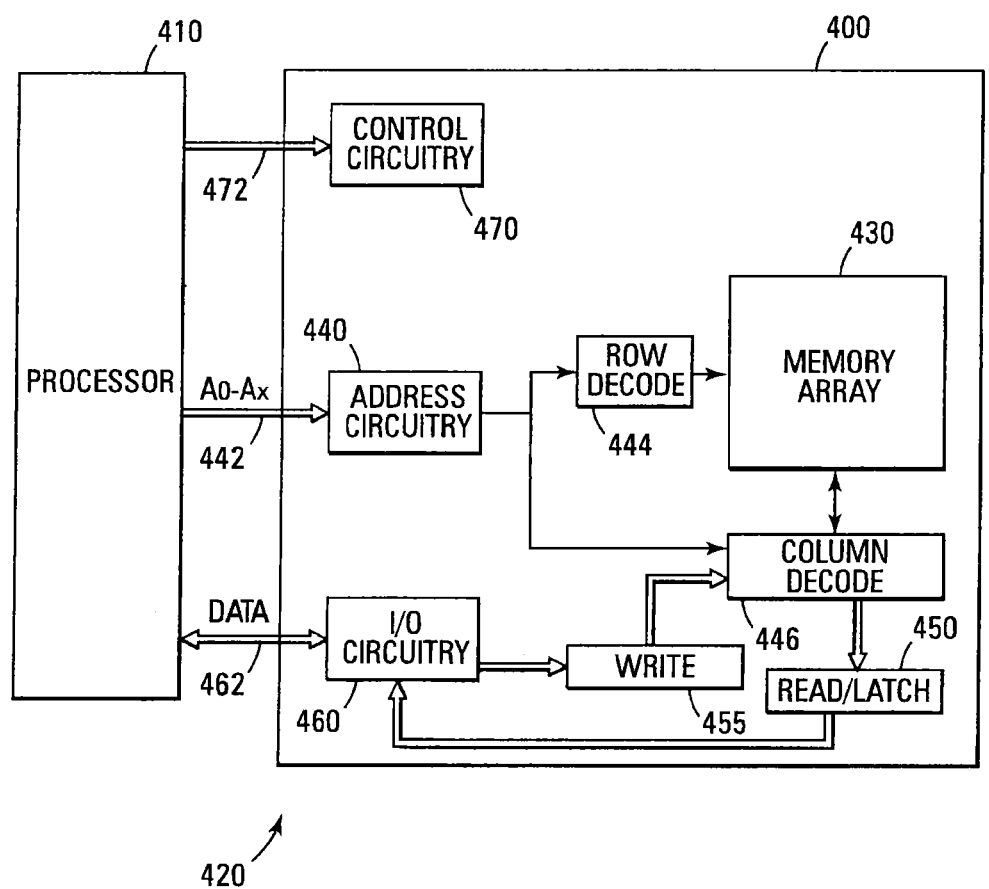
FIG. 4 shows a block diagram of one embodiment of an electronic system of the present invention.

FIG. 4 illustrates a functional block diagram of a memory device 400 of one embodiment of the present invention that is coupled to a processor 410. The processor 410 may be a microprocessor, a processor, or some other type of controlling circuitry. The memory device 400 and the processor 410 form part of an electronic system 420. The memory device 400 has been simplified to focus on features of the memory that are helpful in understanding the present invention.

The memory device includes an array of memory cells 430. In one embodiment, the memory cells are non-volatile floating-gate memory cells and the memory array 430 is arranged in banks of rows and columns as illustrated in the embodiment of FIG. 3.

An address buffer circuit 440 is provided to latch address signals provided on address input connections A0-Ax 442. Address signals are received and decoded by a row decoder 444 and a column decoder 446 to access the memory array 430. It will be appreciated by those skilled in the art, with the benefit of the present description, that the number of address input connections depends on the density and architecture of the memory array 430. That is, the number of addresses increases with both increased memory cell counts and increased bank and block counts.

The above-described embodiments have focused on a NAND architecture memory array. However, the present invention is not limited to this architecture. The embodiments of the memory block erase method of the present invention can be used in any architecture of memory device (e.g., NAND, NOR, AND).

The memory device 400 reads data in the memory array 430 by sensing voltage or current changes in the memory array columns using sense/latch circuitry 450. The sense/latch circuitry, in one embodiment, is coupled to read and latch a row of data from the memory array 430. Data input and output buffer I/O circuitry 460 is included for bidirectional data communication over a plurality of data connections 462 with the controller 410). Write circuitry 455 is provided to write data to the memory array.

Control circuitry 470 decodes signals provided on control connections 472 from the processor 410. These signals are used to control the operations on the memory array 430, including data read, data write, and erase operations. The control circuitry 470 may be a state machine, a sequencer, or some other type of controller.

The flash memory device illustrated in FIG. 4 has been simplified to facilitate a basic understanding of the features of the memory. A more detailed understanding of internal circuitry and functions of flash memories are known to those skilled in the art.

CONCLUSION

In summary, the implanted n-wells and n− regions of the present invention isolate individual memory blocks or smaller quantities of memory blocks, depending on the embodiment. This reduces the disturb caused by biasing of a particular memory block. Additionally, the charge required to raise an individual p-type region to 20V for an erase operation is substantially reduced due to the segregation of each memory block area. Cycle times with the present invention are also reduced due to the reduced time required Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A semiconductor device, comprising:
a substrate;
wherein the substrate includes an isolated area of a first conductivity type divided into a plurality of isolated regions of the first conductivity type by a plurality of implanted regions of a second conductivity type; and
wherein a separate block of memory cells is formed in each of the plurality of isolated regions of the first conductivity type; and
wherein the plurality of implanted regions of the second conductivity type comprise a plurality of regions having a first conductivity level superimposed over a plurality of areas having a second conductivity level different than the first conductivity level.

2. The semiconductor device of claim 1, further comprising a buried layer below a surface of the substrate, wherein the isolated area is defined in part by the buried layer.

3. The semiconductor device of claim 2, wherein the buried layer comprises a buried layer of the second conductivity type.

4. The semiconductor device of claim 2, wherein the buried layer comprises an insulator layer.

5. The semiconductor device of claim 2, further comprising a plurality of implanted areas of the second conductivity type, wherein the isolated area is further defined by the plurality of implanted areas of the second conductivity type.

6. The semiconductor device of claim 5, wherein the plurality of implanted areas of the second conductivity types comprise a plurality of n-wells implanted substantially down to the buried layer.

7. The semiconductor device of claim 6, wherein the plurality of n-wells implanted substantially down to the buried layer comprise a plurality of n-wells that extend down to the buried layer.

8. The semiconductor device of claim 2, wherein the plurality of regions having the first conductivity level comprise isolating strips that extend substantially down to the buried layer.

9. The semiconductor device of claim 8, wherein the isolating strips that extend substantially down to the buried layer comprise isolating strips that extend down to the buried layer.

10. The semiconductor device of claim 1, wherein a separate block of memory cells being formed in each of the plurality of isolated regions of the first conductivity type comprises a respective plurality of separate blocks of memory cells being formed in each of the plurality of isolated regions of the first conductivity type.

11. The semiconductor device of claim 1, wherein a separate block of memory cells being formed in each of the plurality of isolated regions of the first conductivity type comprises a respective single block of memory cells being formed in each of the plurality of isolated regions of the first conductivity type.

12. The semiconductor device of claim 1, wherein the substrate comprises a silicon substrate.

13. The semiconductor device of claim 12, wherein the silicon substrate comprises a p-doped silicon substrate.

14. The semiconductor device of claim 1, wherein the plurality of areas having the second conductivity level different than the first conductivity level comprise a plurality of source lines.

15. The semiconductor device of claim 1, wherein the plurality of areas having the second conductivity level different than the first conductivity level are implanted into the isolated area.

16. The semiconductor device of claim 1, wherein the plurality of regions having the first conductivity level comprise a plurality of n− regions and wherein the plurality of areas having the second conductivity level different than the first conductivity level comprise a plurality of n+ areas.

17. The semiconductor device of claim 1, wherein the plurality of regions having the first conductivity level have the same width as the plurality of areas having the second conductivity level different than the first conductivity level.

18. The semiconductor device of claim 1, wherein the plurality of areas having the second conductivity level different than the first conductivity level have a greater width than the plurality of regions having the first conductivity level.

19. The semiconductor device of claim 1, wherein the substrate comprises a p-doped silicon substrate, the isolated area of the first conductivity type comprises an isolated p-type area, the plurality of isolated regions of the first conductivity type comprise a plurality of isolated p-type regions, and the plurality of implanted regions of a second conductivity type comprise a plurality of n-regions.

20. A semiconductor device, comprising:
a substrate;
wherein the substrate includes an isolated area of a first conductivity type divided into a plurality of isolated regions of the first conductivity type by a plurality of implanted regions of a second conductivity type; and
wherein a separate block of memory cells is formed in each of the plurality of isolated regions of the first conductivity type; and
further comprising a plurality of source lines formed in the isolated area;
wherein the plurality of source lines are implanted into the isolated area;
wherein the plurality of source lines comprise a plurality of n+ areas; and
wherein the plurality of implanted regions of the second conductivity type comprise a plurality of n− regions superimposed over the plurality of n+ areas.

21. A semiconductor device, comprising:
a substrate;
wherein the substrate includes an isolated area of a first conductivity type divided into a plurality of isolated regions of the first conductivity type by a plurality of implanted regions of a second conductivity type; and
wherein a separate block of memory cells is formed in each of the plurality of isolated regions of the first conductivity type; and
further comprising a plurality of source lines formed in the isolated area;
wherein the plurality of implanted regions of the second conductivity type comprise isolating strips that extend through the source lines.

22. A semiconductor device, comprising:
a substrate;
wherein the substrate includes an isolated area of a first conductivity type divided into a plurality of isolated regions of the first conductivity type by a plurality of implanted regions of a second conductivity type;
wherein a separate block of memory cells is in each of the plurality of isolated regions of the first conductivity type; and
further comprising a buried layer of the second conductivity type below a surface of the substrate and coupled to each of the plurality of implanted regions of the second conductivity type;
wherein the plurality of implanted regions of the second conductivity type comprise a plurality of regions having a first conductivity level superimposed over a plurality of areas having a second conductivity level different than the first conductivity level.

23. A semiconductor device, comprising:
a substrate; and
a buried layer below a surface of the substrate;
wherein the substrate includes an isolated area of a first conductivity type between a pair of wells of a second conductivity type that extend substantially to the buried layer;
wherein the isolated area of the first conductivity type is divided into a plurality of isolated regions of the first conductivity type by a plurality of implanted regions of the second conductivity type, the plurality of implanted regions of the second conductivity type being coupled to the buried layer;
wherein a plurality of source lines is implanted into the isolated area of the first conductivity type and wherein an implanted region of the second conductivity type of the plurality of isolated regions of the second conductivity type is superimposed over each source line; and
wherein a separate block of memory cells is formed in each of the plurality of isolated regions of the first conductivity type.

* * * * *